United States Patent [19]

Oda

[11] Patent Number: 4,815,108
[45] Date of Patent: Mar. 21, 1989

[54] SIGNAL DETECTION APPARATUS

[75] Inventor: Minoru Oda, Hyogo, Japan

[73] Assignee: Mitsubishi Denki Kabushiki Kaisha, Tokyo, Japan

[21] Appl. No.: 178,230

[22] Filed: Apr. 6, 1988

[30] Foreign Application Priority Data

Jun. 26, 1987 [JP] Japan .................................. 62-15786

[51] Int. Cl.$^4$ ............................................. H04B 1/10
[52] U.S. Cl. .................................... 375/102; 375/104; 455/223; 455/304; 455/305
[58] Field of Search .......................... 375/94, 102, 104; 455/223, 224, 303, 304, 312; 307/358; 329/145; 328/108, 109, 110

[56] References Cited

U.S. PATENT DOCUMENTS

| | | | |
|---|---|---|---|
| 3,769,591 | 10/1973 | Brown et al. | 375/104 |
| 4,311,963 | 1/1982 | Watanabe et al. | 375/104 |
| 4,479,252 | 10/1984 | Souchay et al. | 455/223 |
| 4,521,917 | 6/1985 | Holt, Jr. | 455/223 |

Primary Examiner—Benedict V. Safourek
Attorney, Agent, or Firm—Bernard, Rothwell & Brown

[57] ABSTRACT

A signal detection apparatus wherein pulses of the reverse polarity to that of the signal pulse to be detected are detected from an input pulse signal, and thereafter the signal outputting path is cut off for a fixed period, so that noise pulses which have oscillating waveforms in both positive and negative polarites are segregated from the signal pulses which can be provided with a unipolarity, by making use of the difference in polarity, and thereby, the noise pulses are eliminated regardless of their pulse heights. Further, the signal input to the cut-off circuit is delayed for a fixed period of time so that the first peak of the noise pulses may be eliminated even if it is of the same polarity as that of the signal pulse.

6 Claims, 3 Drawing Sheets

SIGNAL DETECTION APPARATUS

BACKGROUND OF THE INVENTION

1. Field of the Invention

The present invention relates to a signal detection apparatus which when used for counting pulse signals or the like is enabled to discriminate between signal pulses and noise pulses so as to detect only the signal pulses.

2. Description of the Prior Art

FIG. 1 and FIG. 2 are explanatory diagrams of prior art signal detection apparatus, in which FIG. 1(a) shows an example where a pulse-height discriminator 8 is used. The pulse-height discriminator 8 is adapted to generate an output signal 13 only when the pulse peak of an input pulse signal 11 as shown in FIG. 1(b) exceeds a preset discrimination voltage 12, and it is therefore made possible to eliminate such noise pulses 14 which have lower pulse peaks than that of the input pulse signal 11 to be detected.

FIG. 2(a) shows an example where a single-channel pulse-height analyzer 15 is used. The single-channel pulse-height analyzer 15 is adapted to generate an output signal 13 only when the pulse peak of an input pulse signal 11 as shown in FIG. 2(b) comes in between two preset discrimination voltages 16 and 17. Therefore, it is made possible to eliminate such noise pulses 14 whose pulse peaks are lower or higher than that of the input pulse signal 11 to be detected.

Since prior art signal detection apparatus are structured as described above, there have been such problems that it is not possible in the case of FIG. 1 to eliminate noise pulses whose pulse heights are comparable to or higher than that of the signal pulse, and in the case of FIG. 2, to eliminate noise pulses whose pulse peaks are comparable to that of the signal pulse.

SUMMARY OF THE INVENTION

The present invention was made to solve the above mentioned problems, and accordingly, it is a primary object of the present invention to provide an input signal detection apparatus which will positively eliminate noise pulses no matter what pulse height they have.

According to one aspect of the present invention, there is provided a first pulse-height discriminator for detecting pulses which have the same polarity as that of the signal to be detected, a delay circuit connected to the input side or output side of the first pulse-height discriminator, a second pulse-height discriminator for detecting pulses having reverse polarity to that of the signal to be detected, a monostable circuit to be triggered by the output signal of the second pulse-height discriminator, and a gate circuit for cutting off the output signal of the aforesaid first pulse-height discriminator or delay circuit for the duration of an output signal from the said monostable circuit.

Other objects and advantages of the present invention will become more fully understood from the following description of the embodiments with reference to the accompanying drawings.

DESCRIPTION OF THE PREFERRED DRAWINGS

FIG. 1 and, FIG. 2 are explanatory diagrams of the prior art signal detection apparatus;

DESCRIPTION OF THE PREFERRED EMBODIMENTS

Figure 1:
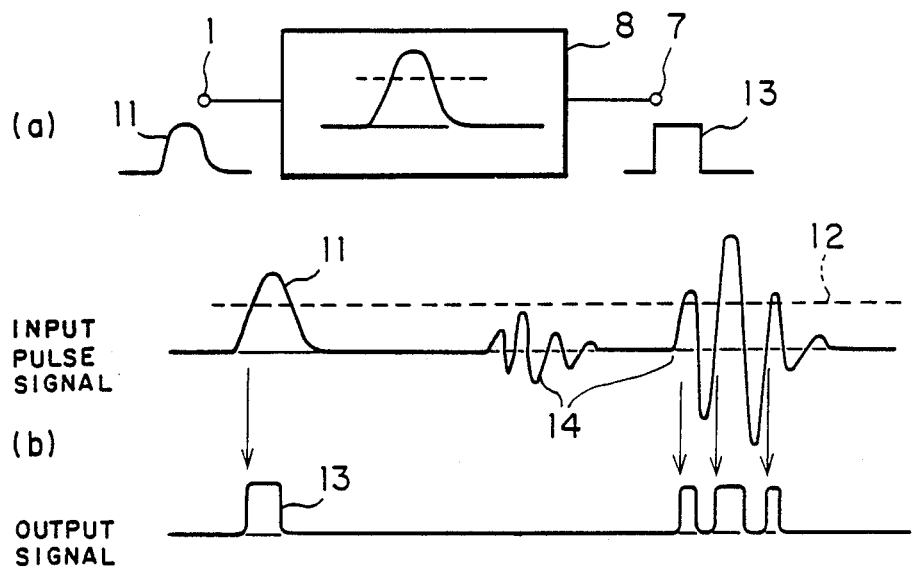
Figure 2:
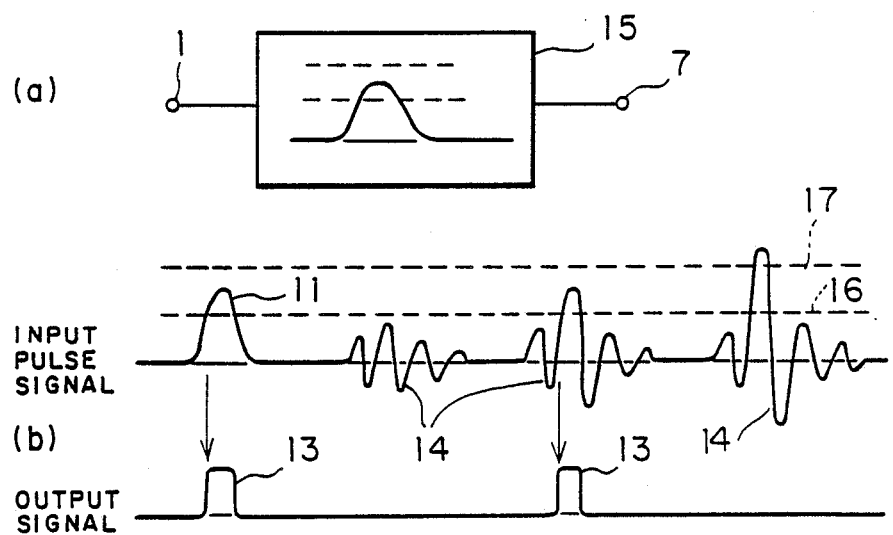
Figure 3:
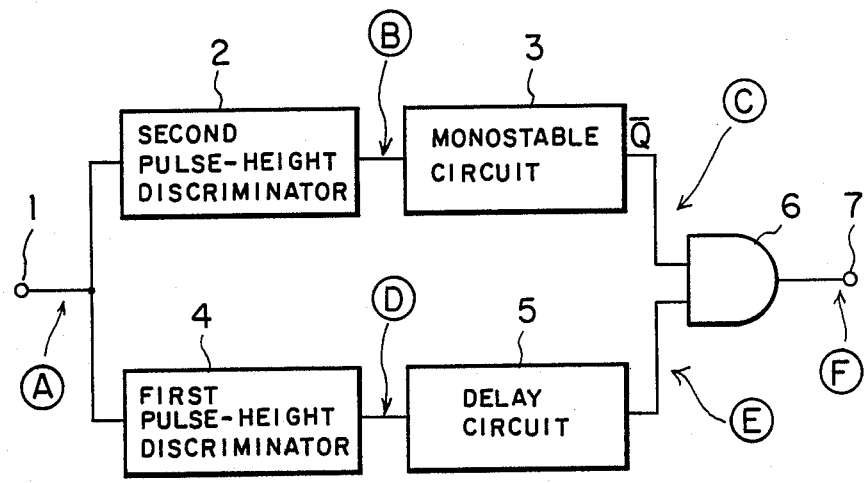
FIG. 3 is a block diagram showing a signal detection apparatus according to an embodiment of the present invention.

An embodiment of the present invention will be described below with reference to the accompanying drawings. Referring to FIG. 3, reference numeral 1 denotes an input terminal, 2 denotes a pulse-height discriminator connected to the input terminal 1, 3 denotes a monostable circuit connected to the output of the pulse-height discriminator 2, 4 denotes a pulse-height discriminator connected to the input terminal 1, denotes a delay circuit connected to the output side of the pulse-height discriminator 4, 6 denotes an AND gate receiving the outputs of the monostable circuit 3 and the delay circuit 5, and 7 denotes an output terminal.

Figure 4:
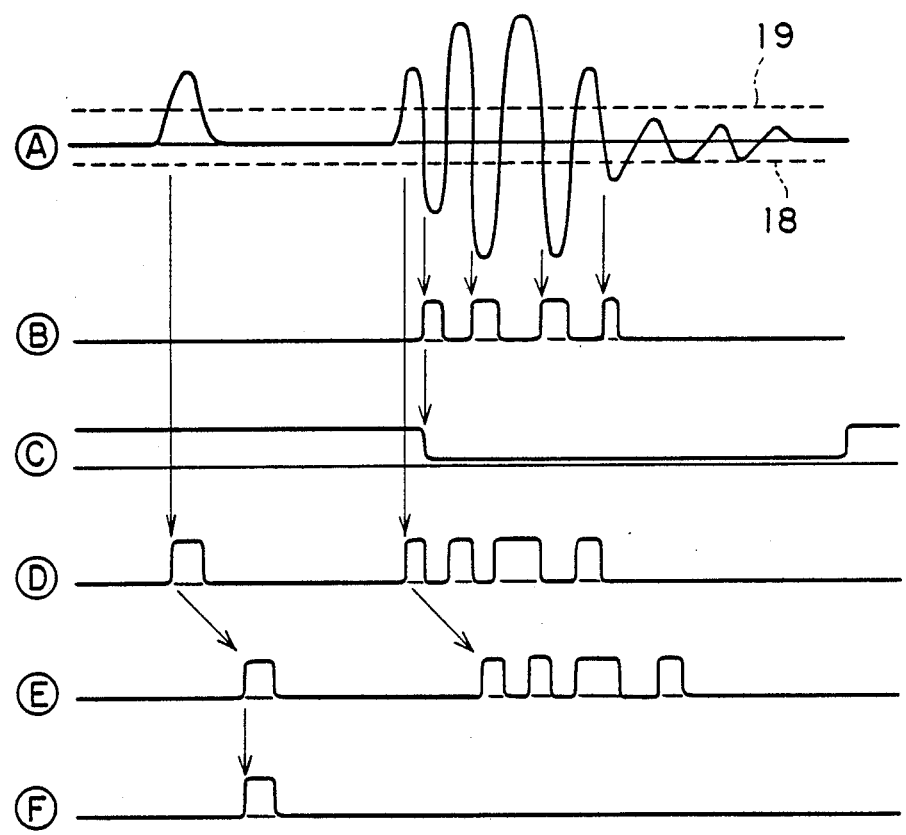
FIG. 4 is a waveform chart of signals at various points in the apparatus of FIG. 3.

FIG. 4 is a waveform chart of signals at points (A)–(F) in FIG. 3. Referring to FIG. 4, 18 denotes the discrimination voltage of the pulse-height discriminator 2 and 19 denotes the discrimination voltage of the pulse-height discriminator 4.

Operations in FIG. 3 will be described with reference to FIG. 4. When an input pulse signal [FIG. 4(A)] in which signal pulses and noise pulses are mixed is supplied to the input terminal 1, the pulse-height discriminator 2 outputs an output signal [FIG. 4(B)] responding to such an input pulse signal whose polarity is reverse to that of the signal pulse to be detected and whose pulse-peak is higher than that of the preset discrimination voltage 18.

The monostable circuit 3 triggered by the output signal of the pule-height discriminator 2 generates an output signal [FIG. 4(C)] having a fixed pulse width at its negative logical output terminal $\overline{Q}$.

The pulse-height discriminator 4 outputs an output signal [FIG. 4(D)] responding to such an input pulse whose polarity is the same as that of the signal to be detected and whose pulse is higher than that of the preset discrimination voltage 19.

The delay circuit 5 outputs an output signal [FIG. 4(E)] in which the output signal of the pulse-height discriminator 4 is delayed by a fixed period of time. The AND gate 6 outputs a logical product signal [FIG. 4(F)] of the output signals of the monostable circuit 3 and the delay circuit 5. The logical product signal is the output signal of the present circuit arrangement as a whole and appears at the output terminal 7. This signal, as understood by referring to waveforms (A) through (F) in FIG. 4, is in response only to the signal pulse to be detected but not to any noise pulse.

Now, description will be made about conditions under which the circuit of FIG. 3 operates as designed. The first condition is that the pulse width of the output signal of the monostable circuit 3 is longer than the duration of a train of noise pulses.

Generally, the duration of the noise pulses from most of the noise sources which we experience (such as switching surge of an electric motor and electric welding noise) is within 10 milliseconds and this fact serves as a criterion for determining the aforesaid pulse width.

Some types of monostable circuits 3 have facility to be re-triggered. If such a type is utilized, it becomes possible to obtain a pulse having a pulse width automatically adapted to the duration of noise pulses.

A monostable circuit 3 having the facility to be re-triggered is adapted to respond to the last pulse in a train of input pulses so as to maintain its output pulse for a fixed period of time counted anew from when it received the last pulse. Hence, even if the pulse width is preset to be rather short, the pulse width of the output therefrom can be automatically prolonged in response to an input train of noise pulses of longer duration.

In such a case, the output pulse width from the monostable circuit 3 against an input single pulse can be set to be as short as 0.1 millisecond. However, the pulse width should not be made so short as to become shorter than the oscillation period of the noise pulse.

The oscillation period of a noise pulse is frequently determined by the electrical resonant frequency of the transmission path of the signal and it generally is within the range from 0.1 to 10 microseconds. As an example of the oscillation period becoming extremely long, there is a case where a switching surge of an electromagnetic relay is directly induced. In such a case, the oscillation period comes to be on the order of a millisecond.

The second condition is that the delay introduced by the delay circuit 5 is longer than the oscillation period of the noise pulse. The function of the delay circuit 5 is, when the first peak of a train of noise pulses is of the same polarity as that of the signal pulse, to cause the output pulse of the pulse-height discriminator 4 corresponding to that noise pulse to be put in the width of the output pulse of the monostable circuit 3. Hence, the delay is required to be at least longer than a half of the oscillation period of the noise pulse.

The third condition is that the discrimination voltage of the pulse-height discriminator 2 is sufficiently small. Although this voltage should be set higher than the level of the normally existent noise such as that from the amplifier but is preferred to be set as low as possible. Another condition necessary for determining this voltage is that the voltage is set lower than the discrimination voltage of the pulse-height discriminator 4 for the signal detection.

Figure 5:
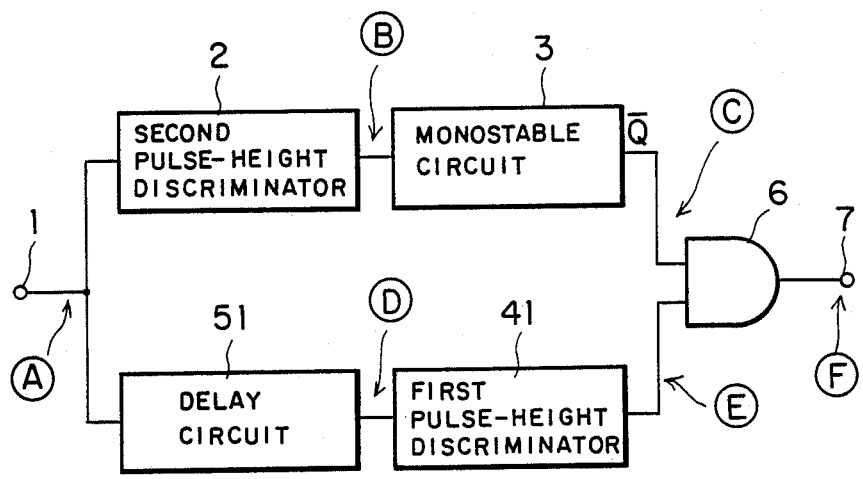
FIG. 5 is a block diagram showing another embodiment of the present invention.

The order of insertion in the circuit of the pulse-height discriminator 4 and the delay circuit 5 arranged in the above described embodiment can be reversed as shown in FIG. 5. In this case, the input pulse signal of FIG. 4(A) is input to the pulse-height discriminator 4 after being delayed so that the output signal as shown in FIG. 4(E) is obtained. Basically, this arrangement performs the same function as performed in the embodiment of FIG. 3.

Figure 6:
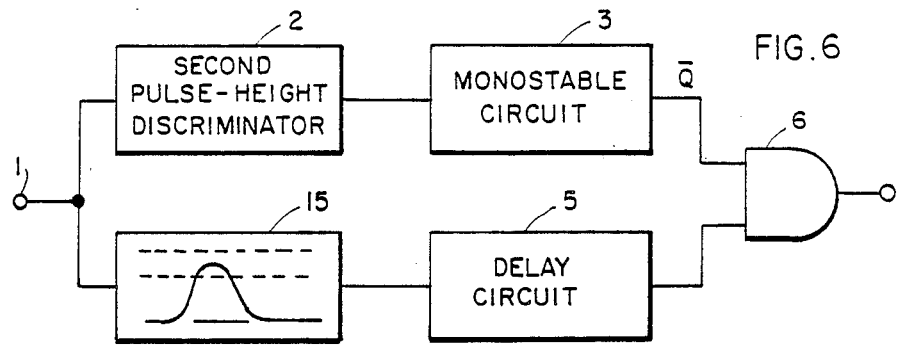
FIG. 6 is a block diagram of still another embodiment of the invention.

Further, instead of the pulse-height discriminator 4, a single-channel pulse-height analyzer can be employed as shown in FIG. 6. In this case, since noise pulses are removed according to two indicators, i.e., polarity and pulse height, the noise pulse eliminating capability is enhanced.

As described so far, the present invention is enabled to discriminate signal pulses from noise pulses regardless of the height of noise pulses, and therefore, such an effect is obtained that the detection or counting of signal pulses can be stably executed in an environment abundant in noise sources. Therefore, the present invention is especially effective for use in such apparatus of which highly reliable performance in the counting of signal pulses is required such as nuclear instrumentation and radio-activity monitors for nuclear reactors.

What is claimed is:

1. A signal detection apparatus comprising:
   (a) a pulse-height detector having an input for receiving pulse signals and responsive to voltage of the same polarity as that of the pulse signal to be detected;
   (b) a delay circuit connected to the output side of said pulse-height detector;
   (c) a pulse-height discriminator having an input for receiving pulse signals and provided with a discrimination voltage of the reverse polarity to that of the pulse signal to be detected;
   (d) a monostable circuit connected to the output side of said pulse-height discriminator; and
   (e) a gate circuit connected to said delay circuit for cutting off the output signal of said delay circuit responsive to and for the duration of an output signal from said monostable circuit.

2. A signal detection apparatus according to claim 1, wherein said pulse-height detector comprises a single-channel pulse-height analyzer.

3. A signal detection apparatus according to claim 1 wherein said pulse height detector comprises a pulse-height discriminator.

4. A signal detection apparatus comprising:
   (a) a pulse-height detector having an input for receiving pulse signals and responsive to voltage of the same polarity as that of the pulse signal to be detected;
   (b) a delay circuit having an input for receiving pulse signals and responsive to voltage of the said polarity as that of the pulse signal to be detected;
   (c) a pulse-height discriminator having an input for receiving pulse signals and provided with a discrimination voltage of the reverse polarity to that of the pulse signal to be detected;
   (d) a monostable circuit connected to the output side of said pulse-height discriminator; and
   (e) a gate circuit connected to said pulse height detector for cutting off the output signal of said pulse-height detector responsive to and for the duration of an output signal from said monostable circuit.

5. A signal detection apparatus according to claim 4 wherein said pulse height detector comprises a single-channel pulse-height analyzer.

6. A signal detection apparatus according to claim 4 wherein said pulse-height detector comprises a pulse-height discriminator.

* * * * *

UNITED STATES PATENT AND TRADEMARK OFFICE
CERTIFICATE OF CORRECTION

PATENT NO. : 4,815,108
DATED : March 21, 1989
INVENTOR(S) : Minoru Oda

It is certified that error appears in the above-identified patent and that said Letters Patent is hereby corrected as shown below:

On the cover page, under "Foreign Application Priority Data", "62-15786" should be --62-157867--.

Column 1, line 59, delete "said";

lines 65 and 66, the title "DESCRIPTION OF THE PREFERRED DRAWINGS" should be --BRIEF DESCRIPTION OF THE DRAWINGS--;

line 67, after "and" delete the comma ",".

Column 2, line 20, before "denotes" insert --5--;

line 40, "pule-height" should be --pulse-height--.

Signed and Sealed this

Twentieth Day of March, 1990

Attest:

JEFFREY M. SAMUELS

*Attesting Officer*  *Acting Commissioner of Patents and Trademarks*